United States Patent
Wu

(10) Patent No.: US 6,727,519 B1
(45) Date of Patent: Apr. 27, 2004

(54) PACKAGE STRUCTURE OF ORGANIC ELECTROLUMINESCENCE PANEL

(75) Inventor: Chin-Long Wu, Tainan (TW)

(73) Assignee: RiTdisplay Corporation, Hsinchu (TW)

( * ) Notice: Subject to any disclaimer, the term of this patent is extended or adjusted under 35 U.S.C. 154(b) by 0 days.

(21) Appl. No.: 10/612,610

(22) Filed: Jul. 1, 2003

(51) Int. Cl.[7] .............................................. H01L 29/267
(52) U.S. Cl. .............................. 257/81; 257/88; 257/99; 257/79; 438/22; 438/26; 438/28; 438/30; 438/34
(58) Field of Search ....................... 257/81, 88, 79–103; 438/22, 26, 28, 30, 34

(56) References Cited

U.S. PATENT DOCUMENTS

| | | | | |
|---|---|---|---|---|
| 5,747,363 A | * | 5/1998 | Wei et al. ....................... | 438/5 |
| 5,869,929 A | * | 2/1999 | Eida et al. .................... | 313/501 |
| 6,180,960 B1 | * | 1/2001 | Kusuda et al. ................. | 257/91 |
| 6,496,973 B1 | * | 12/2002 | Kusuda et al. ................. | 716/19 |
| 6,583,442 B2 | * | 6/2003 | Ito ............................... | 257/79 |
| 6,621,213 B2 | * | 9/2003 | Kawashima ................. | 313/506 |
| 2002/0084536 A1 | * | 7/2002 | Sundahl et al. ............. | 257/784 |
| 2003/0141807 A1 | * | 7/2003 | Kawase ....................... | 313/498 |

* cited by examiner

Primary Examiner—David A. Zarneke
Assistant Examiner—Thanh Y. Tran
(74) Attorney, Agent, or Firm—J.C. Patents

(57) ABSTRACT

A package structure of OEL panel is composed of a printed circuit board, one or multiple OEL panels, and multiple bumps. Wherein, the OEL panel has multiple poly solder interconnection arranged in an array structure. The printed circuit board has multiple solder pads, and bumps are disposed on the solder pads. The one or more OEL panel are disposed on the printed circuit board with the electric coupling via the poly solder interconnections, so as to have the electric connection for the OEL panel and the printed circuit board.

28 Claims, 14 Drawing Sheets

PACKAGE STRUCTURE OF ORGANIC ELECTROLUMINESCENCE PANEL

BACKGROUND OF THE INVENTION

1. Field of the Invention

The present invention relates to a package structure of an organic electroluminescence (OEL) panel. More particularly, the present invention relates to a package structure of an OEL panel, having the poly solder interconnection arranged in an array structure.

2. Description of Related Art

The OEL device is a device that uses the organic functional materials with the property of spontaneous light-emitting to achieve the displaying effect. According to the different molecular weight of the organic functional materials, it can be categorized into a small molecular organic light emitting device (SM-OLED) and the polymer light-emitting device (PLED).

The OEL device is using two electrodes to hold an organic light emitting material film from both sides. When a proper bias is applied on it, the electric holes will be injected to the anode and the electrons will be injected to the cathode. Due to this externally applied electric field, a voltage difference is produced. This causes carriers to be moved in the film and cause a recombination of electrons and holes, wherein a portion of electron-holes recombine and release energy, which excites the molecules to an excited state as the excited molecules. The excited molecules will release the excited energy, when excited molecules return back to the ground state. A certain portion of the released energy is release via the photons, resulting in emitting light. This is the basic mechanism for the OEL device to emit the light. Since the kind of organic electroluminescence device has the ability to spontaneously emit light, it has many advantages of large viewing angle, fast response time, low driving voltage, full color, and so on, and therefore is expected to be the technology on the planar displaying device for the new generation. Currently, the OEL device has been developed to the stage in practical application. Also and, it can be expected about the application on the color planar displaying device for the next generation, such as the displaying panel for any size, the outdoor post panel, computer, and TV screen. However, comparing with the other displaying technology, the development for OEL device is a little late, the technology have not been completely developed yet. Thus, it is still has many aspects needing further development during the stage to commercialize the OEL displaying device.

Referring to FIG. 1, FIG. 1 is a drawing, schematically illustrating a package structure for the conventional OEL panel. The U.S. Pat. No. 5,747,363 has disclosed a package for an OEL panel, in which the OEL panel mainly includes an OEL panel 100 and a substrate 108. Wherein, the OEL panel 100 has a number of stripe-like anodes 102, an organic light emitting layer 104, and a number of stripe-like cathodes 106. The substrate 108 is implemented with a driving chip 112 and connection pins 110. The pins 110 on the substrate 108 are electrically coupled to the anodes 102 and the cathodes 106 on the OEL panel 100 via an anisotropic conductive film (ACF).

Even though the package structure for the foregoing OEL panel can effectively integrate the driving chip onto the same substrate, it still encounters a restriction of size when a larger size is eventually desired.

Referring to FIG. 2, FIG. 2 is a drawing, schematically illustrating a package structure for another conventional OEL panel. The U.S. Pat. No. 5,693,170 illustrates another package structure for a OEL panel, which includes a several display bricks 200, and a common-use substrate 206 with several bumps 210. Wherein, the displaying bricks 200 have several contact pads 202 near to the surface of the common-use substrate 206. The contact pads 202 are used for the electric connection with the electrodes of anode and cathode on the displaying bricks 200 via, for example, the plugs 204. The common-use substrate 206 is implemented with several contact pads 208 with respect to the contact pads 202. The bumps 210 are implemented between the contact pads 202 and the contact pads 208, so as to have electric connection.

Even though the foregoing package structure for the OEL panel can use several displaying bricks for assembly, so as to achieve the objective of large size, during soldering the contact pads and the bumps, the necessary high temperature in the solder reflowing process would often cause the common-use substrate to be warped. Moreover, the high temperature solder reflowing process would also cause improper affection on the organic light emitting layer in the OEL panel.

SUMMARY OF THE INVENTION

An objective of the present invention is to provide a package structure for the OEL panel with less issue on low stress force and better conductivity.

Another objective of the present invention is to provide a package structure for the OEL panel, in which multiple OEL panels can be assembled to the same printed circuit board, so as to breakthrough the restriction of size for the large size.

In accordance with the foregoing and other objectives of the present invention, the invention provides a package structure of the OEL panel, including a printed circuit board, one or multiple OEL panels, and multiple bumps. Wherein, the printed circuit board has multiple solder pads, and at least one OEL panel is implemented on the printed circuit board. The bumps are respectively disposed between the solder pads on the printed circuit board and the poly solder interconnections, so as to have the electric connection for the OEL panel and the printed circuit board.

In the invention, the OEL panel includes a substrate, a first anode, at least one patterned organic light emitting layer, a second electrode, and a poly solder interconnection arranged in an array structure. Wherein, the first electrode is implemented on the substrate. The first electrode includes a driving region and at least one contact region, in which the contact region is protruding out from the driving region. The patterned organic light emitting layer is implemented on the substrate and exposes the contact region. The second electrode is disposed on the organic light emitting layer but not covering the contact region as a design principle. The poly solder interconnection is disposed on the contact region and the second electrode, and is arranged to form an array structure.

In the invention, the driving region of the first electrode on the OEL panel and the second electrode are, for example, the stripe pattern. Also and, the extending direction of the first electrode is, for example, perpendicular to the extending direction of the second electrode.

In the invention, the patterned organic light emitting layer has multiple openings. The openings expose the contact regions, so as to allow the first electrode to be connected out. In addition, the patterned organic light emitting layer includes, for example, stripe patterns, so as to expose the contact regions and be helpful for the first electrode to be connected out.

In the invention, the OEL panel includes, for example, a single-layer panel with a first electrode, an organic light emitting layer, and a second electrode.

In the invention, the OEL panel includes, for example, a multi-layer panel with a first electrode, a hole injection layer, a hole mobile layer, an organic light emitting layer, an electron injection layer, an electron mobile layer and a second electrode.

In the invention, the substrate includes a transparent substrate, such as the glass substrate, the plastic substrate, or soft substrate. The plastic substrate and the soft substrate can include polycarbonate (PC) substrate, polyester (PET) substrate, cyclic olefin copolymer (COC) substrate, metallocene-based cyclic olefin copolymer (mCOC) substrate or thin glass. The first electrode includes, for example, indium tin oxide (ITO), indium zinc oxide (IZO), or aluminum zinc oxide (AZO). The second electrode includes, for example, metal. The poly solder interconnection includes a material with low reflowing temperature, such as silver paste, gold paste, chrome paste, or nickel paste. The printed circuit board includes, for example, a ceramic printed circuit board, and the bumps include, for example, gold stud bump.

In the invention, during the fabricating process for the OEL panel, in addition to the formation of the organic light emitting layer, it can also include formation of a hole injection layer, a hole mobile layer, an electron mobile layer, and an electron injection layer, so as to form a multi-layer structure panel.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Embodiment 1

Figure 1:
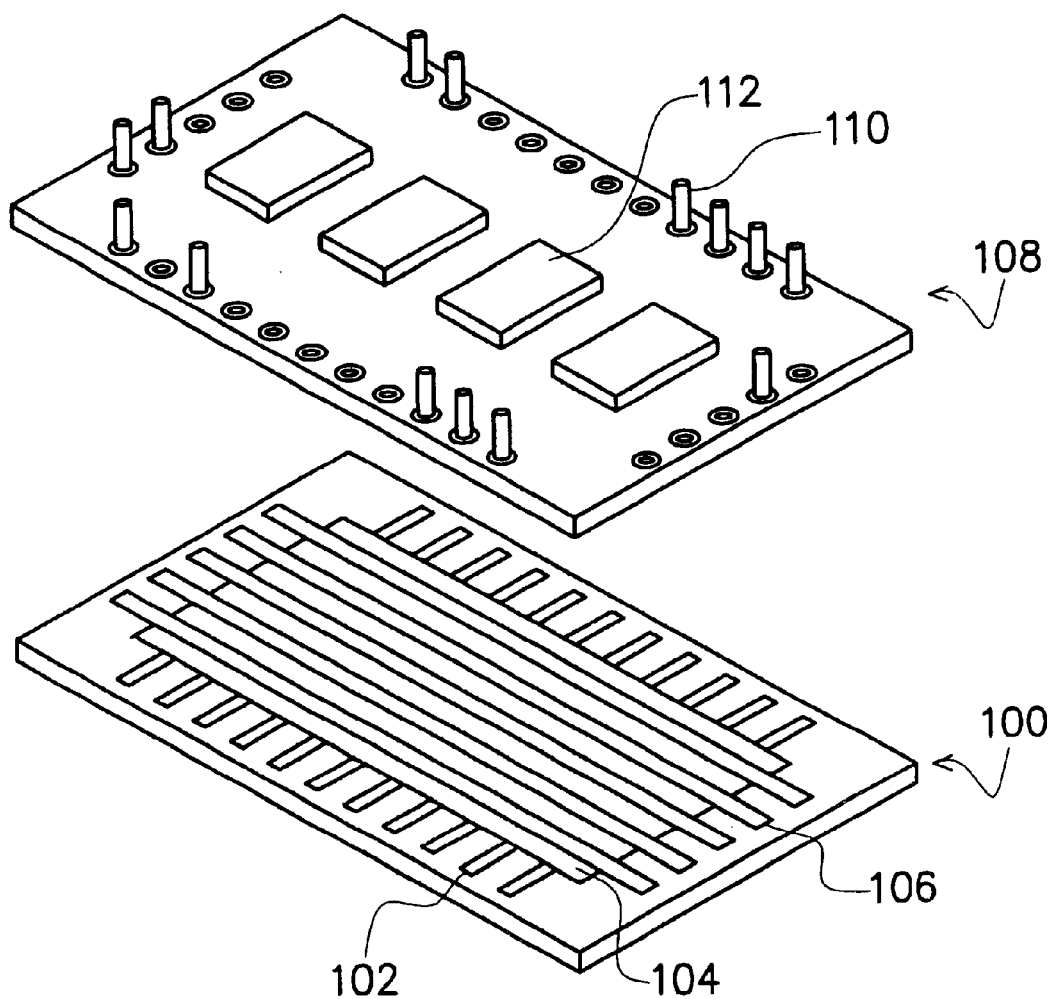
FIG. 1 is a drawing, schematically illustrating a package structure for the conventional OEL panel.
Figure 2:
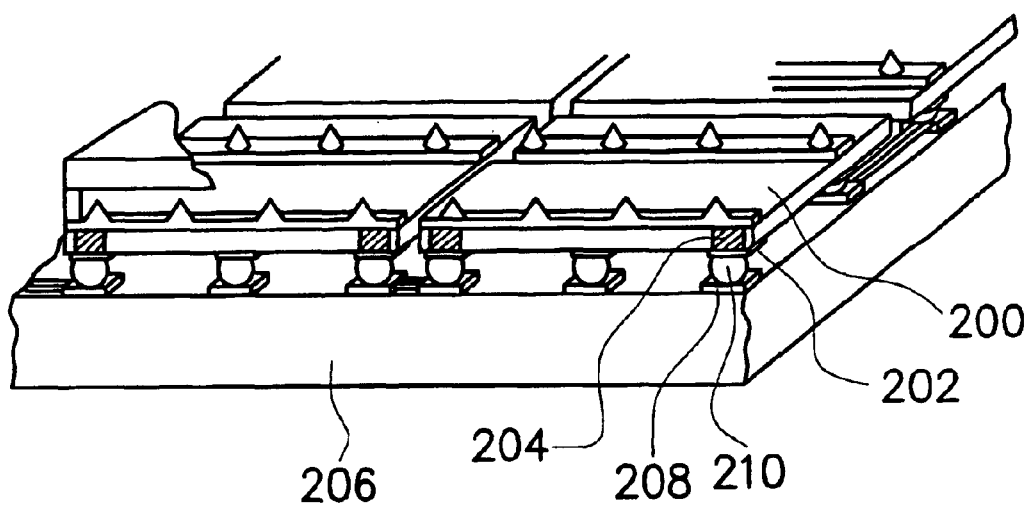
FIG. 2 is a drawing, schematically illustrating another package structure for the conventional OEL panel.
Figure 3:
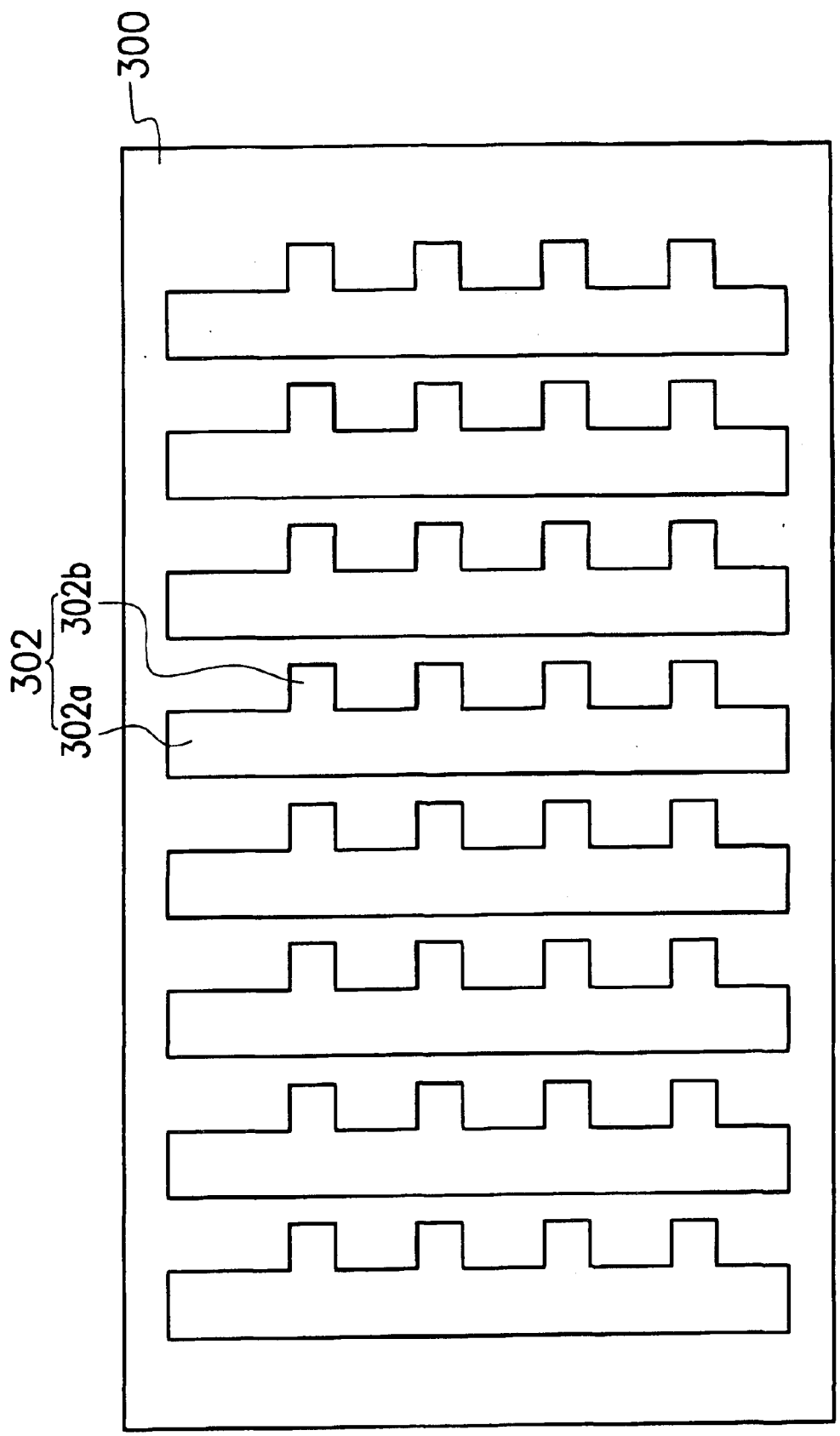
FIGS. 3–6 are drawings, schematically illustrating the process to fabricating an OEL panel, according to a first embodiment of the present invention.

FIGS. 3–6, are drawings, schematically illustrating the process to fabricate an OEL panel, according to a first embodiment of the present invention. In FIG. 3, a transparent substrate 300 is provided. The transparent substrate 300 includes, for example, glass, acrylate, or other transparent materials. The transparent substrate 300 is formed with several anodes 302. The anode 302 includes a driving region 302a and at least one contact region 302b. The anode 302 includes the material, such as indium tin oxide (ITO) or other transparent conductive material. Wherein, the driving region 302a has, for example, a stripe pattern and parallel to each other, on the transparent substrate 300. The contact region 302b is protruding out from the driving region 302a, and is used for external connection to the other region.

Figure 4:
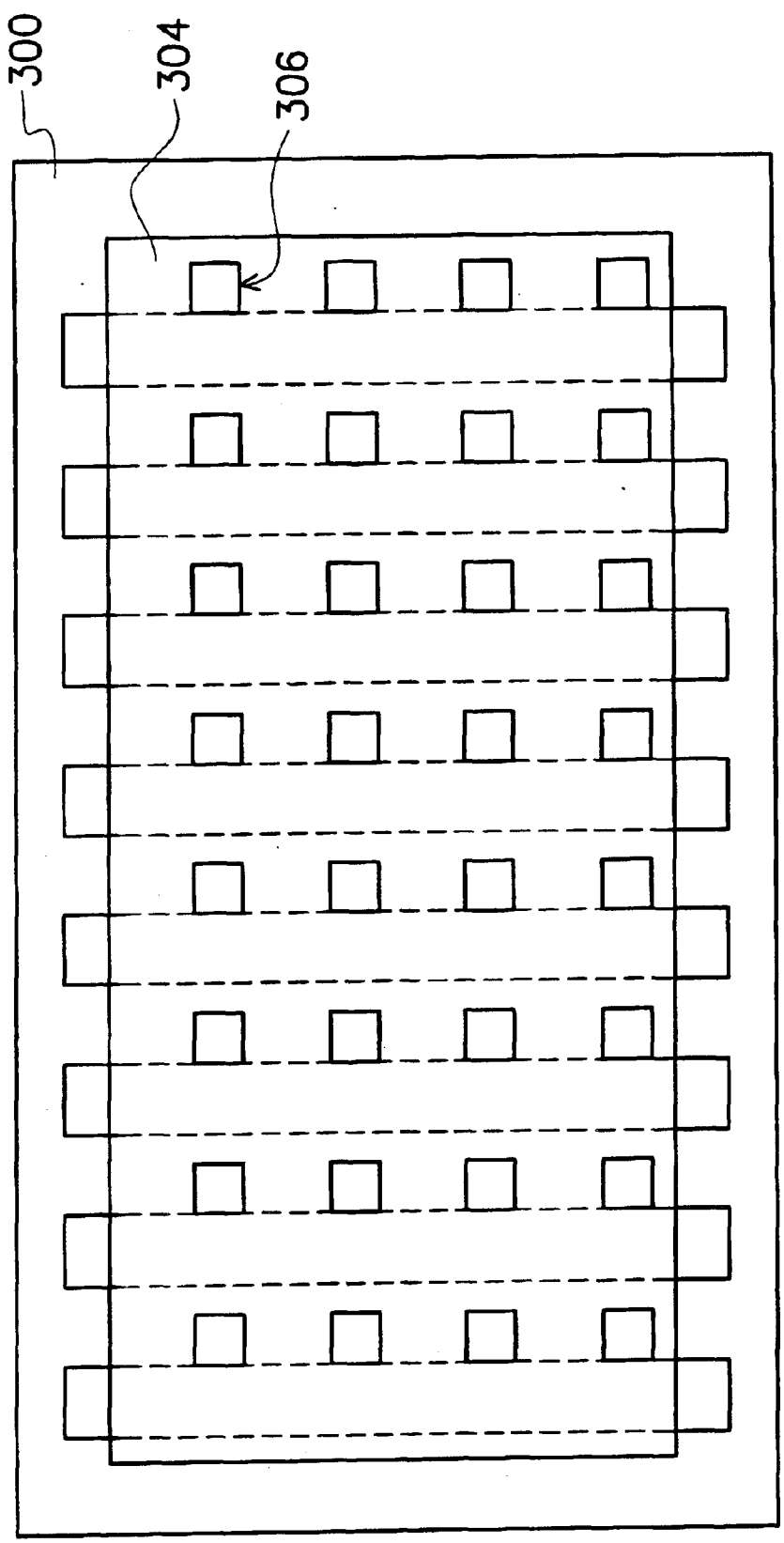

Referring to FIG. 4, after the anodes 302 have been formed, a patterned organic light emitting layer 304 is formed on the transparent substrate 300. The patterned organic light emitting layer 304 includes, for example, several openings 306. The positions of the opening 306 are, for example, corresponding to the positions of the contact regions 302a. Wherein, the patterned organic light emitting layer 304, for example, covers over the driving regions 302a of the anodes 302, but the contact regions 302b of the anodes 302 are exposed by the openings 306.

Figure 5:
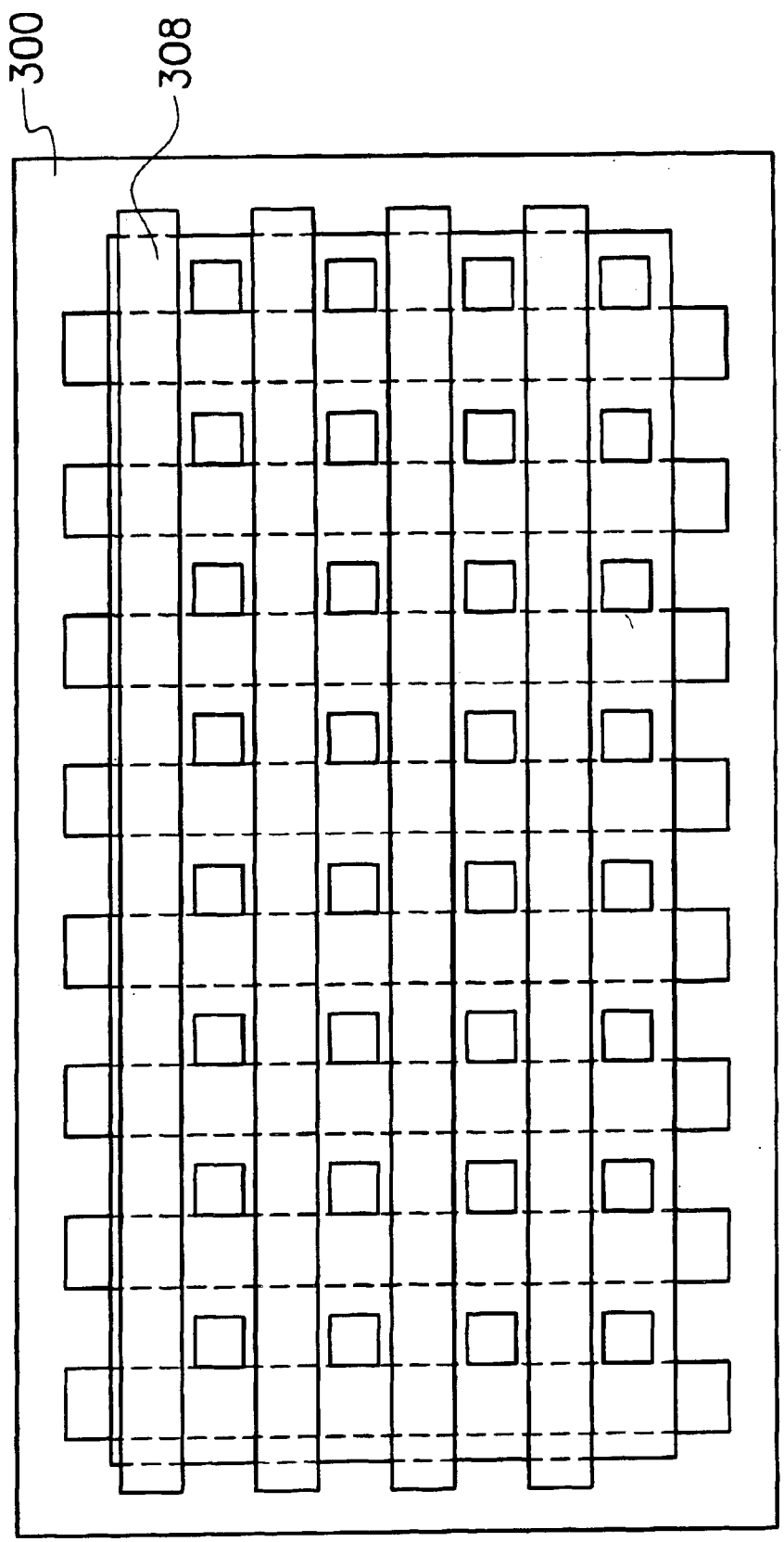

Referring to FIG. 5, after the patterned organic light emitting layer 304 has been formed, several cathodes 308 are formed. The cathodes 308, for example, are in a strip pattern and parallel to each other, on the patterned organic light emitting layer 304. Wherein, the cathode 308 includes, for example, metallic material. Also and, an extending direction of the cathodes 308 is, for example, perpendicular to the extending direction of the driving region 302a of the anode 302. In addition, the distribution position of the cathode 308, in principle, does not cover the contact regions 302b, which have been exposed by the openings 306 (see FIG. 4).

Figure 6:
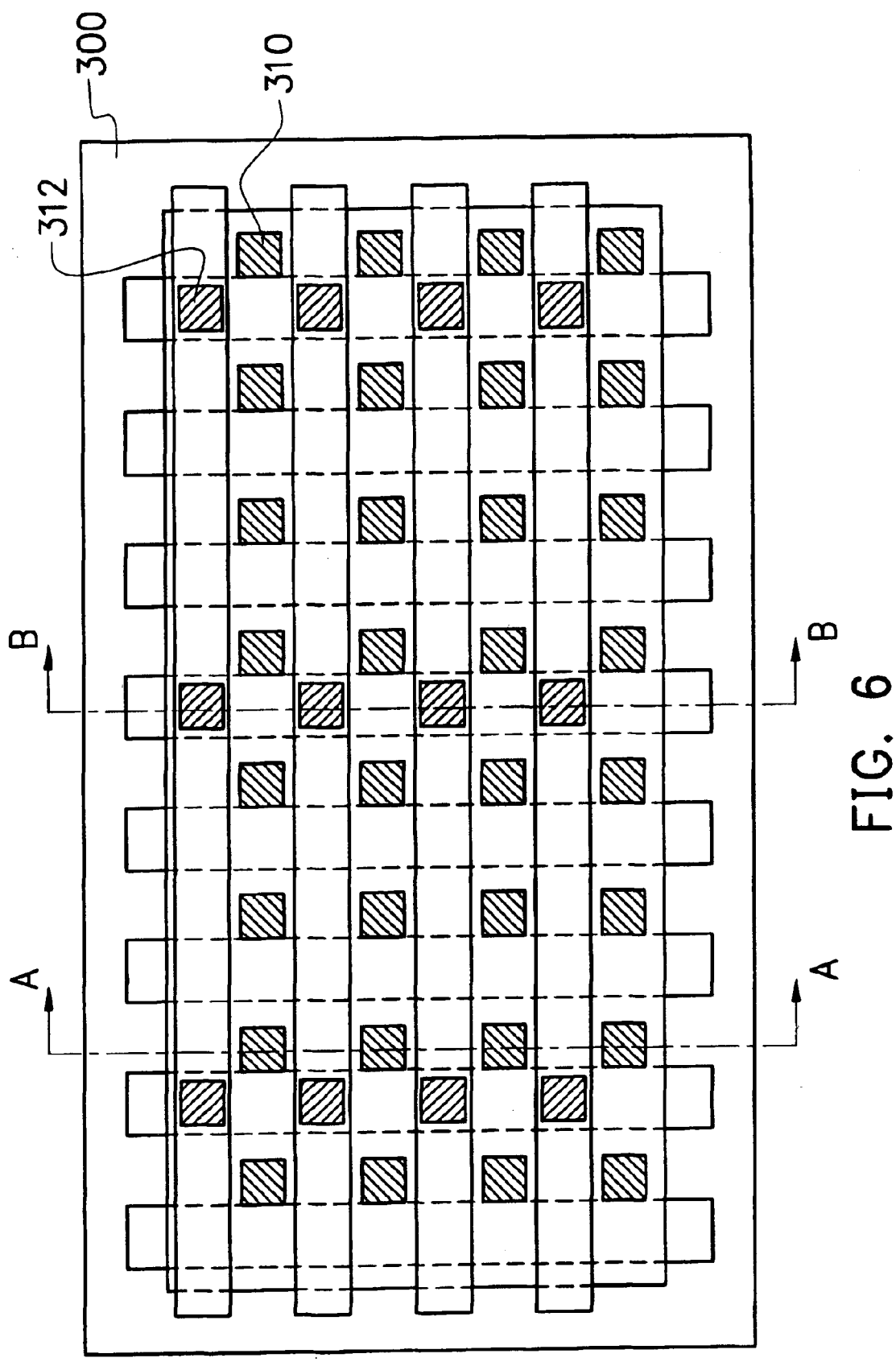

Referring to FIG. 6, after the cathodes 308 have been formed, poly solder interconnections 310 are respectively formed on the contact regions 302b, which have been exposed by the openings 306. Also and, the cathode 308 is formed with at least one poly solder interconnection 312 at the proper position. Wherein, the material of the poly solder interconnections 310 and 312, such as the silver paste, has the lower reflowing temperature, in which the reflow temperature for the silver paste is about less than 100° C. The poly solder interconnections 310 are electrically coupled to the contact regions 302b, and the poly solder interconnections 312 are electrically coupled to the cathodes 308. It can be clear seen in figures that the anode 302 can be electrically coupled out through the poly solder interconnections 310, which are electrically coupled with the contact regions 302b. The cathodes 308 can be electrically coupled out through the poly solder interconnections 312. In addition, the poly solder interconnections 310 and the poly solder interconnections 312 on the panel are arranged in an array structure.

Figure 7A:
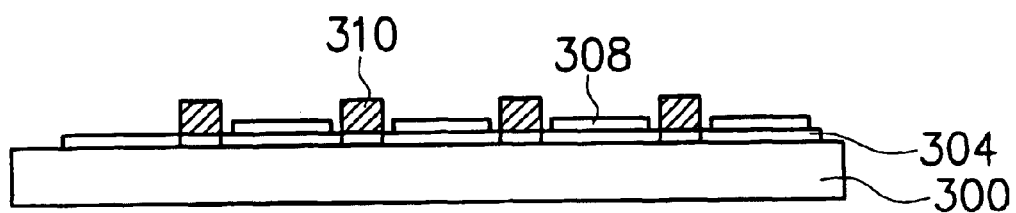
FIGS. 7A–7B are cross-sectional views, schematically illustrating the structure of the OEL panel, according to the first embodiment of the present invention.
Figure 7B:
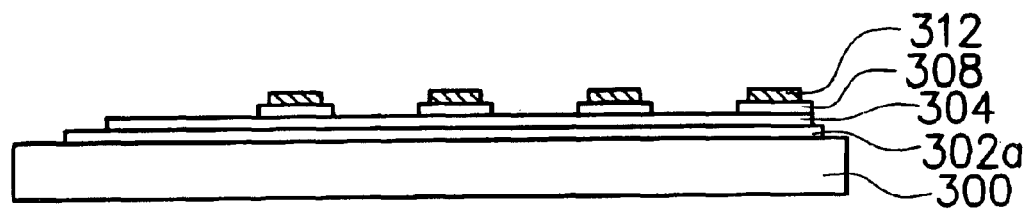

FIGS. 7A–7B are cross-sectional views, schematically illustrating the structure of the OEL panel, according to the first embodiment of the present invention. FIG. 7A is the cross-sectional view along the line A—A in FIG. 6, and FIG. 7B is the cross-sectional view along the line B—B in FIG. 6. In FIG. 7A, it can be clearly seen that the contact regions 302b of the anode 302 is electrically coupled out through the poly solder interconnection 310. In FIG. 7B, it can be clearly seen that the cathode 308 is electrically coupled out through the poly solder interconnection 312.

Figure 8A:
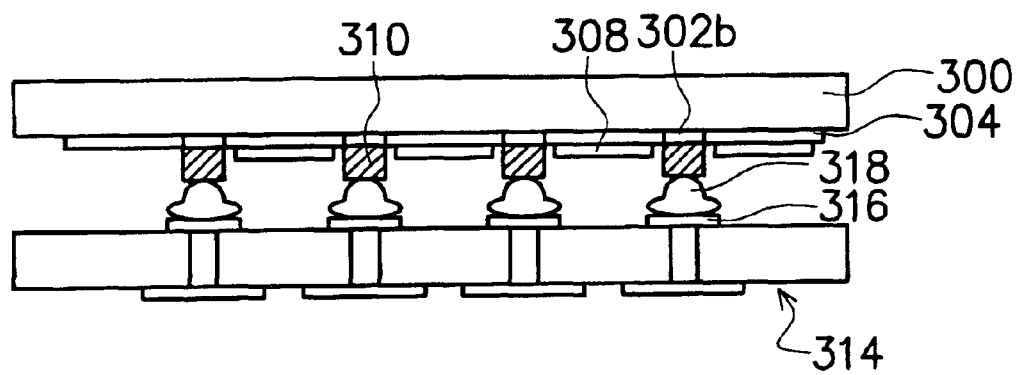
FIGS. 8A–8B are another cross-sectional views, schematically illustrating the structure of the OEL panel, according to the first embodiment of the present invention.
Figure 8B:
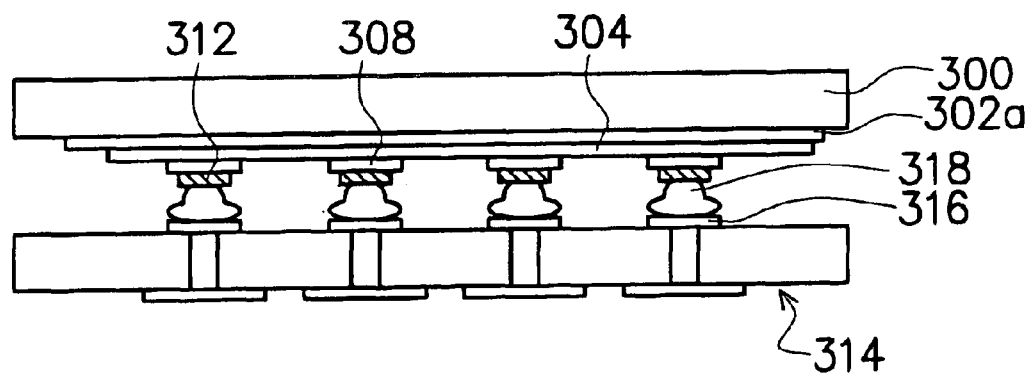
Figure 9:
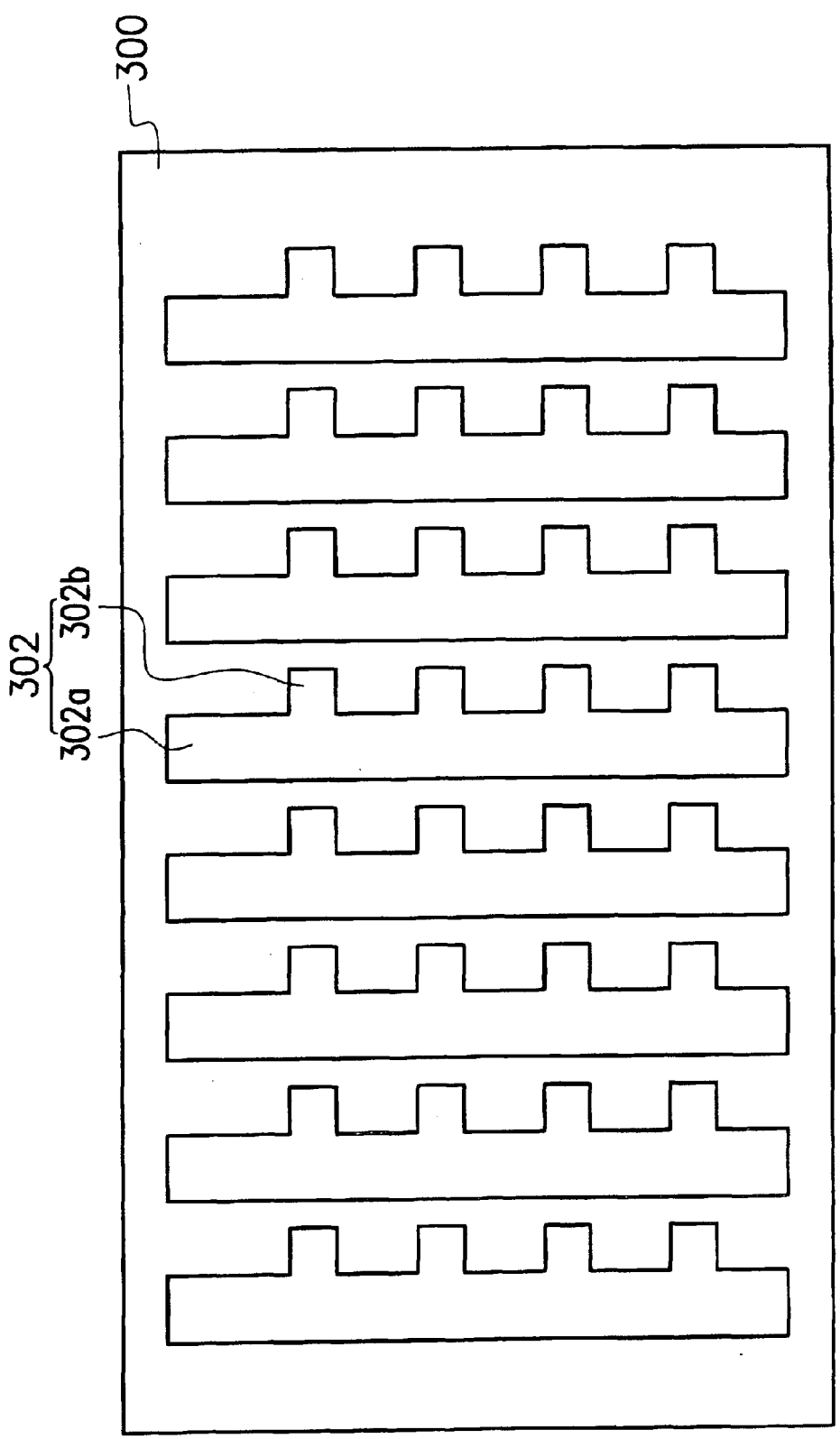
FIGS. 9–12 are drawings, schematically illustrating the process to fabricate an OEL panel, according to a second embodiment of the present invention.

FIGS. 8A–8B are another cross-sectional views, schematically illustrating the structure of the OEL panel, according to the first embodiment of the present invention. The package of the OEL panel mainly includes a printed circuit board 314, several bumps 318, and one or multiple OEL panels. Wherein, the OEL panel has several poly solder interconnections 310, 312 thereon, arranged in an array structure. The printed circuit board 314 has several solder pads 316 and the corresponding trace. The bump 318 is, for example, disposed between the solder pads 316 and the poly solder interconnections 310, 312. In the embodiment, several OEL panel can be assembled on the same printed circuit board 314, so as to further breakthrough the restriction of large size.

In the embodiment, the packaging process for the OEL panel first provides a printed circuit board 314. The bumps 318 are formed on the solder pads 316 of the printed circuit board 314. The formation of the bumps 318 includes, for example, using a method like the wire bonding to form the bumps 318 on the solder pads 316, so as to form a structure like a stud bump. The bumps 318 include, for example, gold bump. However, the skilled artisans should know that the bump 318 in the embodiment is not limited to the gold stud bump. It can be other structure and different materials.

Then, at least one OEL panel, having the poly solder interconnections 310, 312, is flipped over, so that the poly solder interconnections 310, 312 are toward to the printed circuit board 314, and the poly solder interconnections 310, 312 are aligned to the bumps 318 of the solder pads 316. After then, the solder reflowing process is performed, so as to cause the poly solder interconnections 310, 312 to be electrically coupled with the bumps 318. Since the poly solder interconnections 310, 312 ha low reflowing temperature, so that the coupling between the OEL panel and the printed circuit board 314 can be achieved at the temperature less than 100° C. This is rather suitable for requirement in low fabrication temperature for the OEL panel.

In addition, the foregoing printed circuit board 314 is, for example, a ceramic printed circuit board with good thermal dissipation. Since the ceramic printed circuit board is used, this is helpful for the OEL module to have the mechanism of good thermal dissipation.

Embodiment 2

FIGS. 9–12 are drawings, schematically illustrating the process to fabricating a OEL panel, according to a second embodiment of the present invention. First, referring to FIG. 9, a transparent substrate 300 is provided. The transparent substrate 300 includes, for example, glass, acrylate, or other transparent materials. The transparent substrate 300 is formed with several anodes 302. The anode 302 includes a driving region 302a and at least one contact region 302b. The anode 302 includes the material, such as indium tin oxide (ITO) or other transparent conductive material. Wherein, the driving region 302a has, for example, a stripe pattern and parallel to each other, on the transparent substrate 300. The contact region 302b is protruding out from the driving region 302a, and is used for external connection to the other region.

Figure 10:
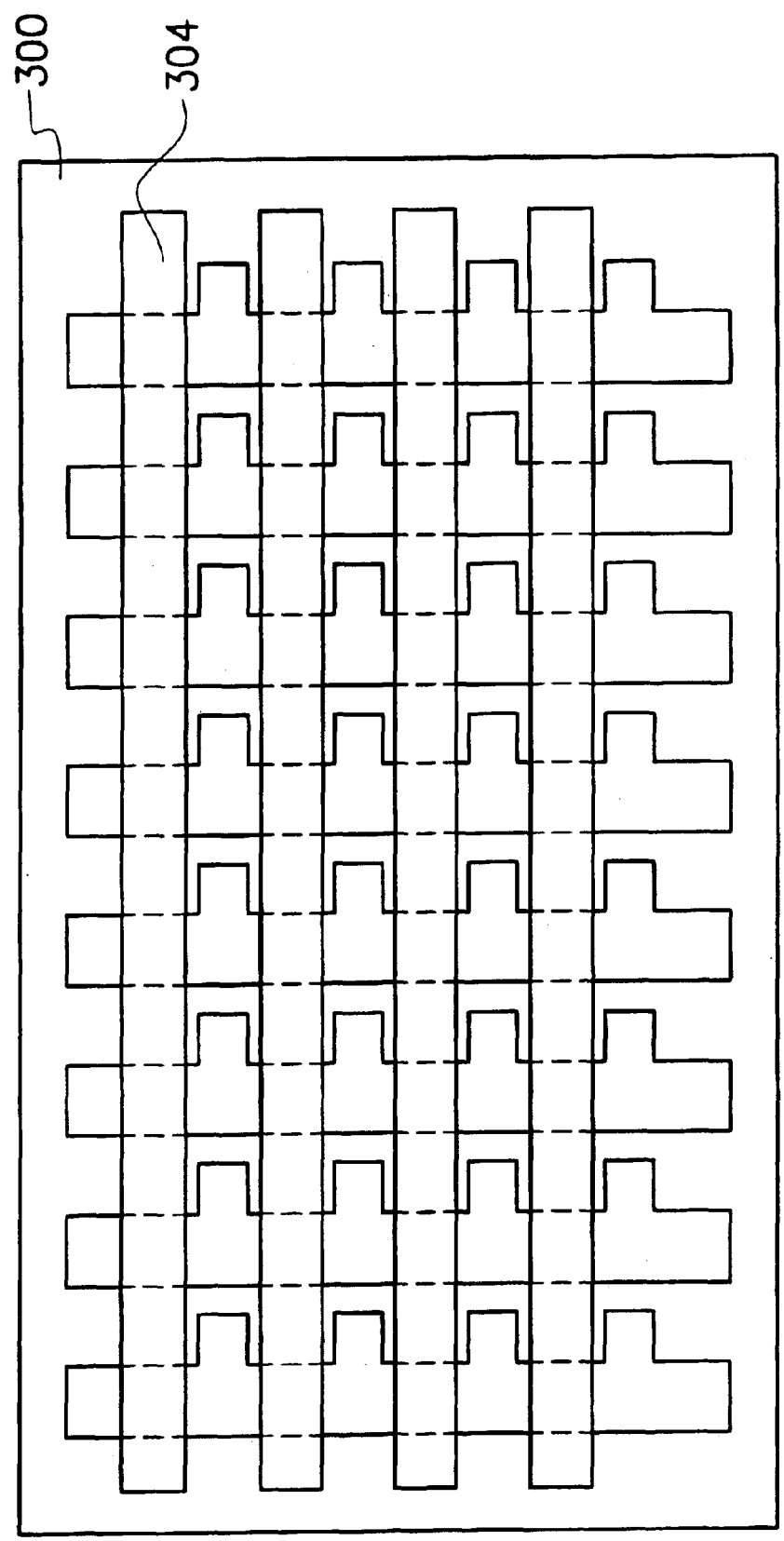

Referring to FIG. 10, after the anodes 302 have been formed, a patterned organic light emitting layer 304 is formed on the transparent substrate 300. The patterned organic light emitting layer 304 includes, for example, several stripe patterns. The distribution position of the patterned organic light emitting layer 304 is in principle not covering the contact regions 302b of the anodes 302, so as to expose the contact regions 302b of the anodes 302.

Figure 11:
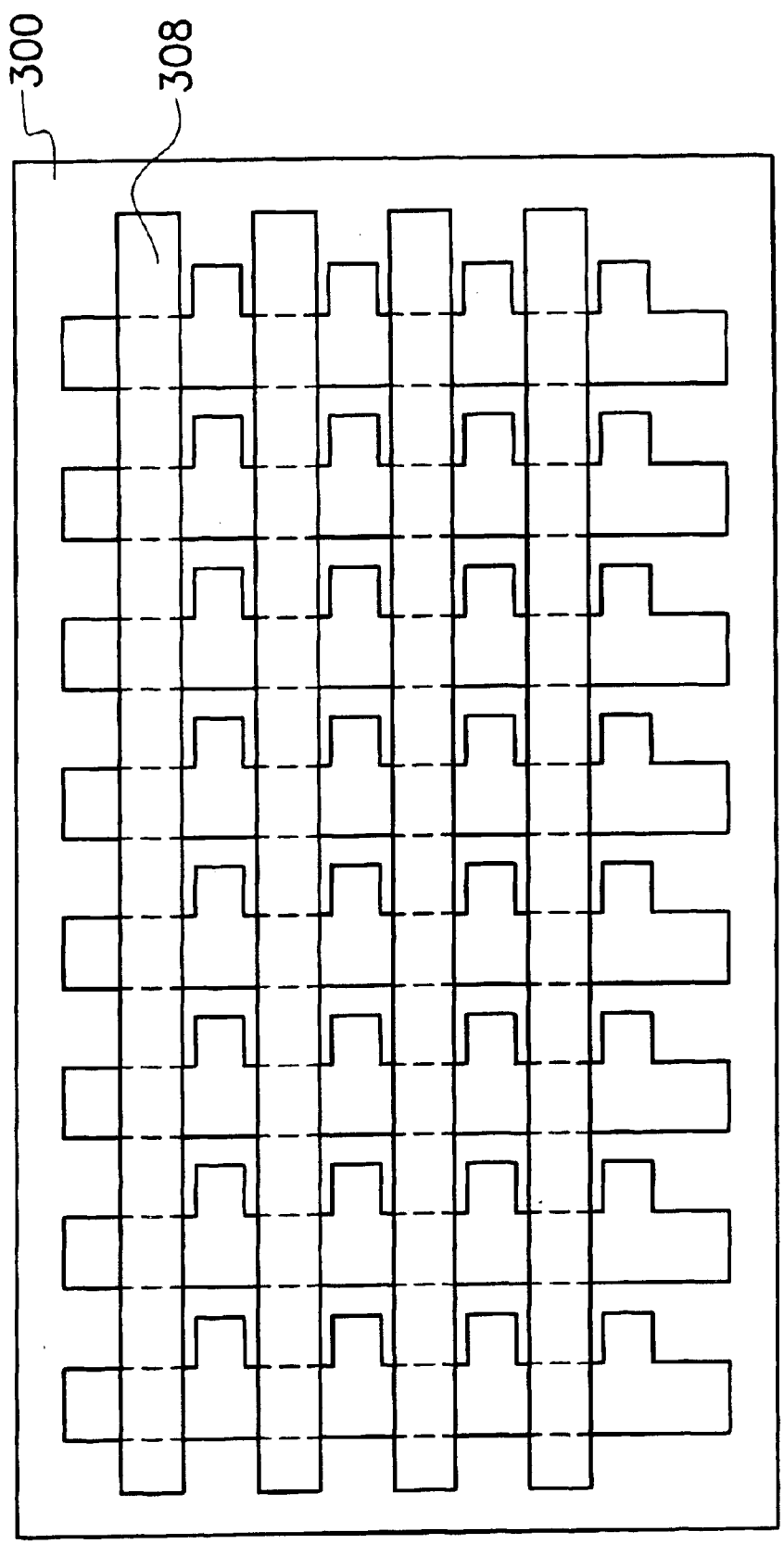

Referring to FIG. 11, after the patterned organic light emitting layer 304 is formed, then several cathodes 308 are formed on the patterned organic light emitting layer 304. The cathode 308 includes, for example, the pattern like the patterned organic light emitting layer 304. Wherein, the extending direction of the cathodes 308 is, for example, perpendicular to the extending direction of the driving region 302a of the anode 302.

Figure 12:
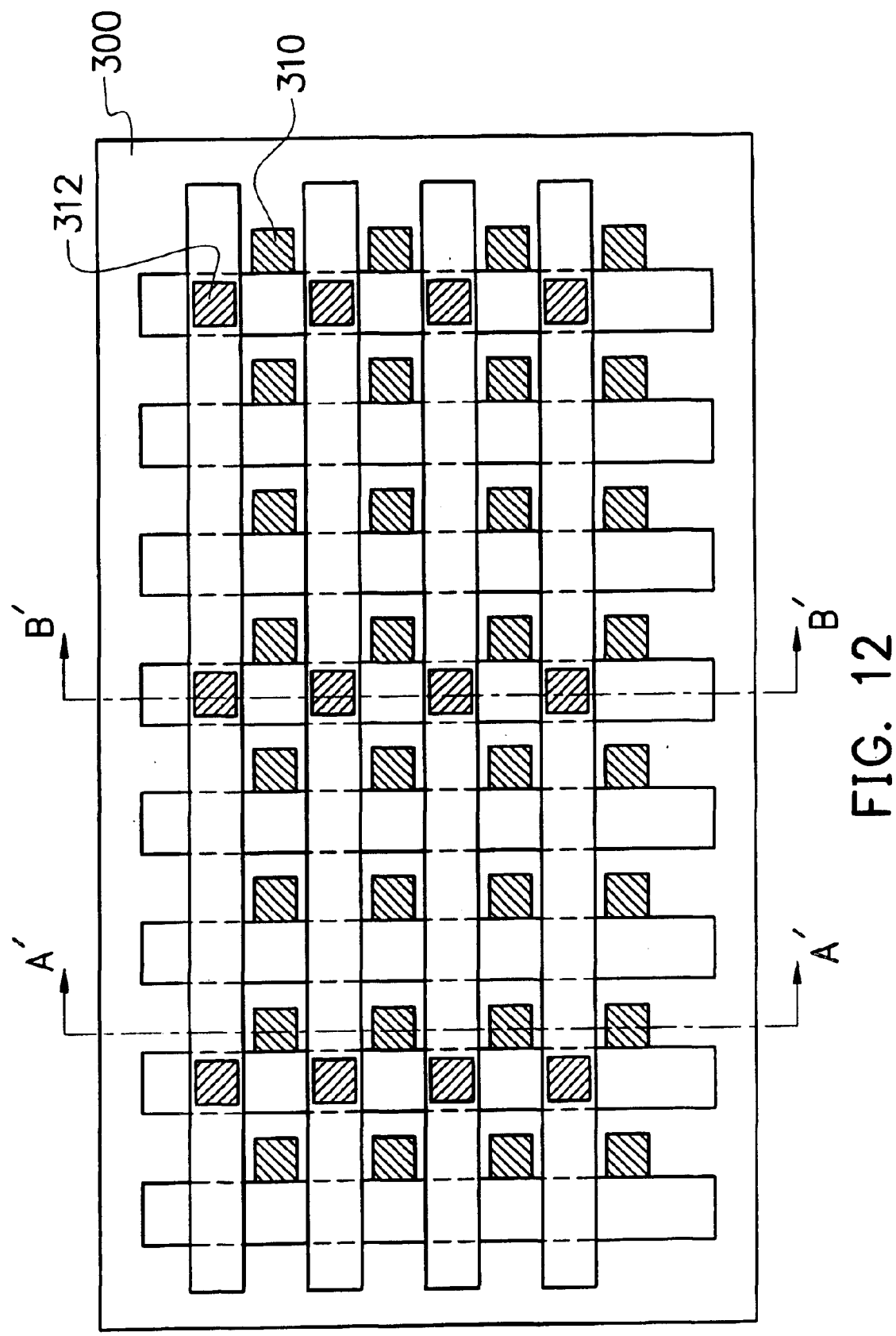

Referring to FIG. 12, after the cathode 308 has been formed, then the poly solder interconnection 310 is formed on the contact region 302b, and at least one poly solder interconnection 312 is formed on the cathode 308 at the proper position. Wherein, the poly solder interconnections 310 and 312 includes, for example, silver paste. The poly solder interconnection 310 is electrically coupled with the contact region 302b, and the poly solder interconnection 312 is electrically coupled with the cathode 308. It is clear as shown in figures that the anode 302 can be coupled out through the poly solder interconnection 310, which is electrically coupled with the contact region 302b. The cathode 308 can be coupled out through the poly solder interconnection 312. In addition, the poly solder interconnections 310 and 312 on the panel are, for example, arranged into an array structure.

Figure 13A:
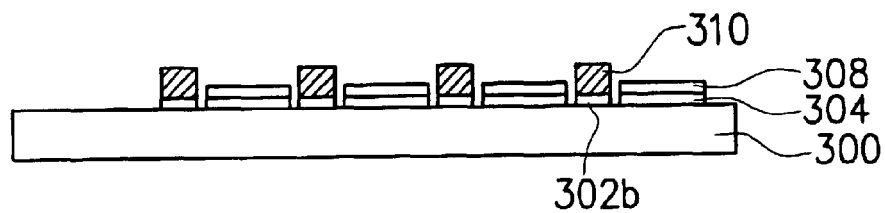
FIGS. 13A–13B are cross-sectional views, schematically illustrating the structure of the OEL panel, according to the second embodiment of the present invention.
Figure 13B:
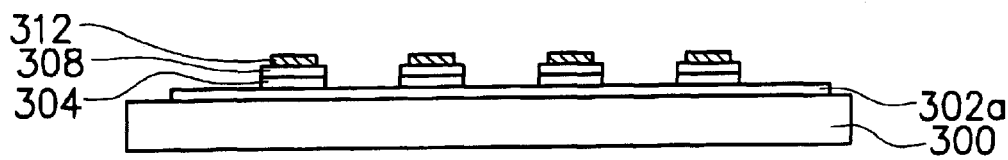

Referring to FIGS. 13A–13B, they are cross-sectional views, schematically illustrating the structure of the OEL panel, according to the second embodiment of the present invention. FIG. 13A is the cross-sectional view along the line A'—A' in FIG. 12, and FIG. 13B is the cross-sectional view along the line B'—B' in FIG. 12. In FIG. 13A, it can be clearly seen that the contact regions 302b of the anode 302 is electrically coupled out through the poly solder interconnection 310. In FIG. 13B, it can be clearly seen that the cathode 308 is electrically coupled out through the poly solder interconnection 312.

Figure 14A:
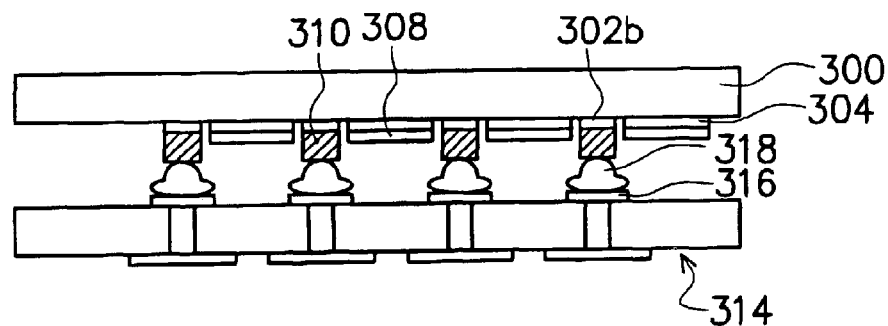
FIGS. 14A–14B are cross-sectional views, schematically illustrating the structure of the OEL panel, according to the second embodiment of the present invention.
Figure 14B:
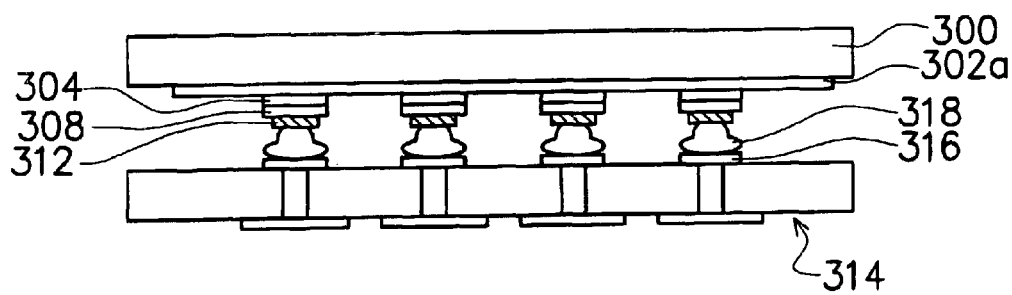

FIGS. 14A–14B are another cross-sectional views, schematically illustrating the structure of the OEL panel, according to the second embodiment of the present invention. The package structure of the OEL panel is similar to the structure as shown in FIGS. 8A and 8B. The difference is the design of the organic light emitting layer 304 in the OEL panel. In FIG. 8A and FIG. 8B, the opening 306 in the organic light emitting layer 304 exposes the contact region 302b. However, in this embodiment, the organic light emitting layer 304 has the stripe pattern, which exposes the contact region 302b.

Figure 15A:
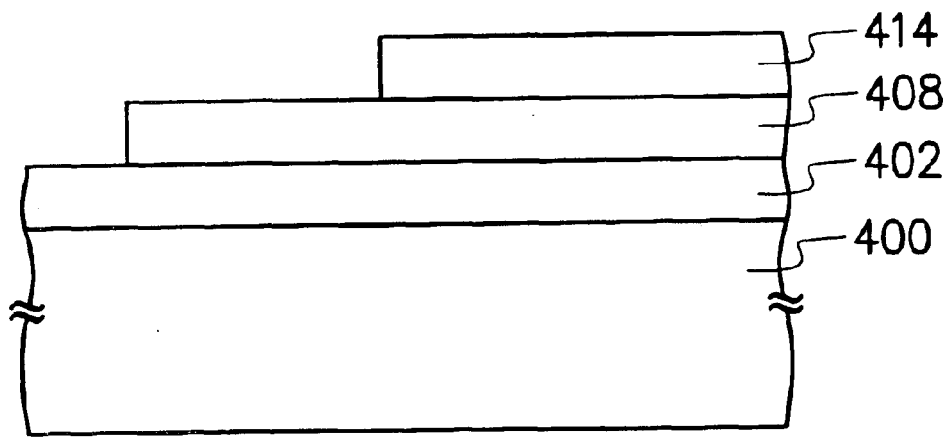
FIGS. 15A–15D are cross-sectional views, schematically illustrating the structure of the OEL panel, according to the first and the second embodiment of the present invention.
Figure 15B:
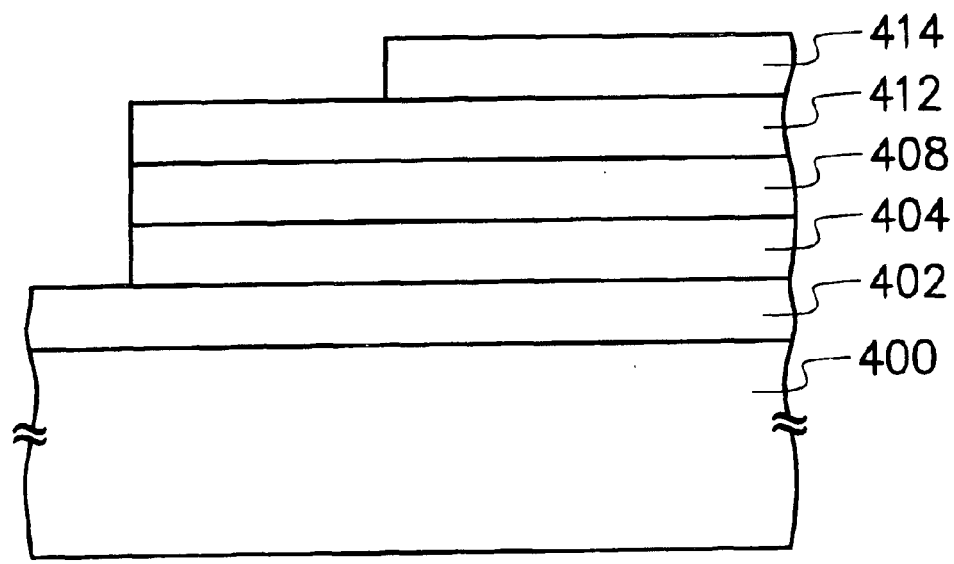
Figure 15C:
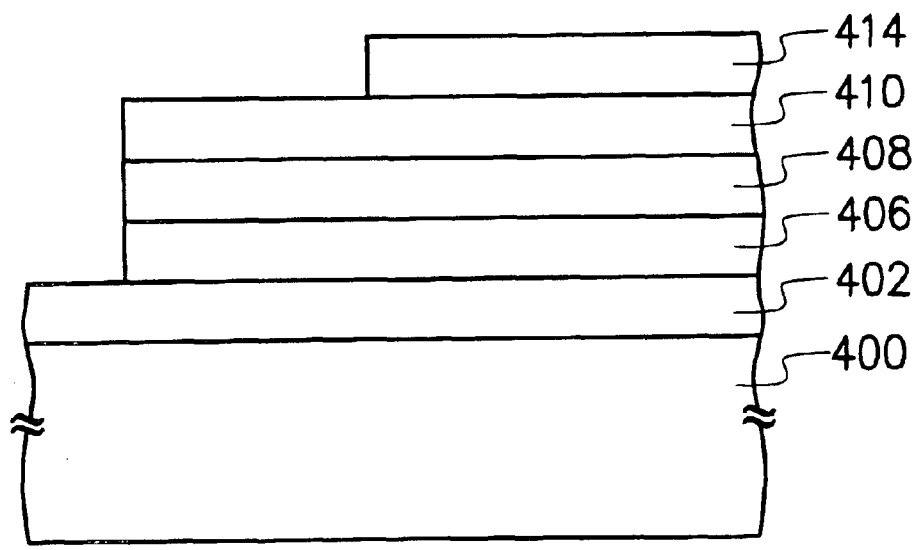
Figure 15D:
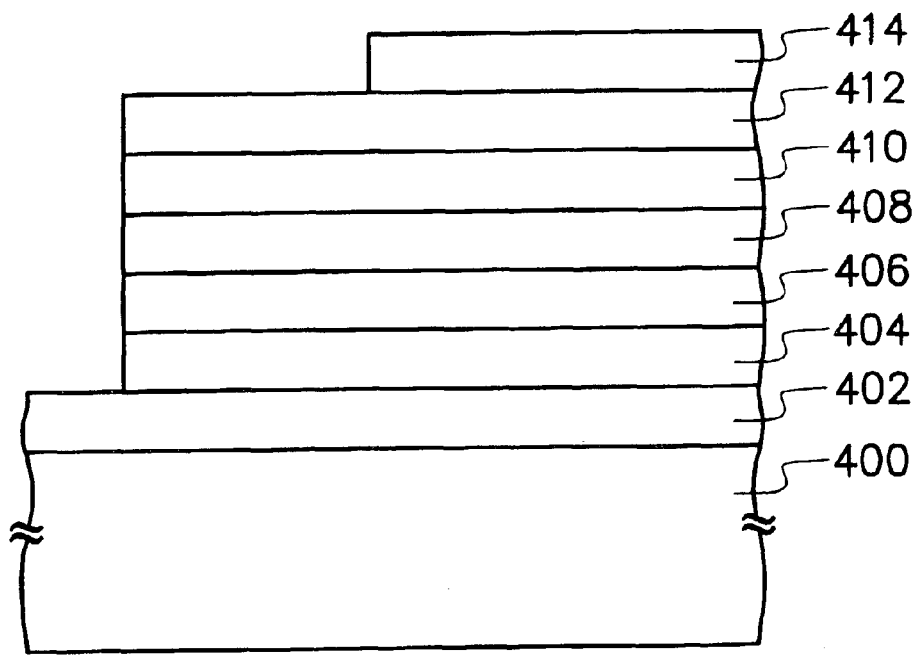

Referring to FIG. 15A and FIG. 15D, they are cross-sectional views, schematically illustrating the structure of the OEL panel, according to the first and the second embodiment of the present invention. In the embodiment 1 and embodiment 2, even though the single-layer structure, of which only one layer of the organic light emitting layer 304 is disposed between the anode 302 and the cathode 308, is taken as the example of OEL panel for descriptions, the skilled artisans should easily know that the OEL panel of the invention can also be a multi-layer structure.

In FIG. 15A, the OEL panel is implemented on a transparent substrate 400. The transparent substrate 400 is implemented with an anode 402, an organic light emitting layer 408, and a cathode 414, as a single-layer structure, of which one layer is disposed between the anode 402 and the cathode 414. In FIG. 15B, the OEL panel includes an anode 402, a hole injection layer 404, an organic light emitting layer 408, an electron injection layer 412, and a cathode 414, as the three-layer structure. In FIG. 15C, the OEL panel includes an anode 402, a hole mobile layer 406, an organic light emitting layer 408, an electron mobile layer 410, and a cathode 414, as the three-layer structure. In FIG. 15D, the OEL panel includes an anode 402, a hole injection layer 404, a hole mobile layer 406, an organic light emitting layer 408, an electron mobile layer 410, an electron injection layer 412, and a cathode 414, as the five-layer structure.

In summary, the invention is directed to package structure and the fabrication process for the OEL panel with several advantages as follows:

1. In the package of the OEL panel in the invention, multiple panels can be integrated on a printed circuit board, so that it is more practical and useful for the OEL panel in consideration of large displaying sale.

2. In the package of the OEL panel in the invention, since the reflowing temperature for the poly solder interconnection is relative low, so that the joint for the OEL panel and the printed circuit board can be achieved at a temperature less than 100° C. This is satisfying the requirement at low temperature for the fabrication process.

3. In the package of the OEL panel in the invention, the ceramic printed circuit board has been used, so that it is helpful for the thermal dissipation mechanism in the OEL module.

4. In the package of the OEL panel in the invention, the connection between the bump and the poly solder interconnection can reduce a lot of the circuit path. This is quite helpful for the OEL panel to be reduced in thickness and weight.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A package structure of organic electroluminescence (OEL) panel, comprising:
   a printed circuit board, having a plurality of solder pads;
   at least one OEL panel, disposed over the printed circuit board, wherein the OEL panel comprises:
   a substrate;
   a plurality of first electrodes, disposed on the substrate, wherein each of the first electrodes includes a driving region and at least one contact region, and the contact region is protruding out from the driving region;
   at least one patterned organic light emitting layer, disposed over the substrate, wherein the patterned organic light emitting layer exposes the contact region;
   a plurality of second electrodes, disposed on the patterned organic light emitting layer; and
   a plurality of poly solder interconnections, disposed on the contact regions and the second electrodes; and
   a plurality of bumps, respectively disposed between the solder pads and the poly solder interconnections, so as to have electric connection between the OEL panel and the printed circuit board.

2. The package structure of claim 1, wherein the driving region for each of the first electrodes is a stripe pattern.

3. The package structure of claim 1, wherein each of the second electrodes is a stripe pattern.

4. The package structure of claim 1, wherein an extending direction of the first electrodes is perpendicular to an extending direction of the second electrodes.

5. The package structure of claim 1, wherein the OEL panel further comprises an electron mobile layer, disposed between the organic light emitting layer and the second electrodes.

6. The package structure of claim 5, wherein the OEL panel further comprises an electron injection layer disposed between the second electrodes and the electron mobile layer.

7. The package structure of claim 1, wherein the OEL panel further comprises a hole mobile layer, disposed between the organic light emitting layer and the first electrodes.

8. The package structure of claim 7, wherein the OEL panel further comprises a hole injection layer disposed between the first electrodes and the electron mobile layer.

9. The package structure of claim 1, wherein the poly solder interconnections includes silver paste.

10. The package structure of claim 1, wherein the printed circuit board includes a ceramic printed circuit board.

11. The package structure of claim 1, wherein the bumps includes gold bumps.

12. The package structure of claim 1, wherein the patterned organic light emitting layer includes a plurality of openings, and the openings expose the contact regions.

13. The package structure of claim 1, wherein patterned organic light emitting layer includes a plurality of stripe patterns, whereby the contact regions are exposed.

14. The package structure of claim 1, wherein the poly solder interconnections include a material with a relative low reflowing temperature.

15. The package structure of claim 1, wherein poly solder interconnections are arranged into an array structure.

16. A package structure of an organic electroluminescence (OEL) panel, comprising:
    a substrate;
    a plurality of first electrodes, disposed on the substrate, wherein each of the first electrodes includes a driving region and at least one contact region, and the contact region is protruding out from the driving region;
    at least one patterned organic light emitting layer, disposed over the substrate, wherein the patterned organic light emitting layer exposes the contact region;
    a plurality of second electrodes, disposed on the patterned organic light emitting layer; and
    a plurality of poly solder interconnections, disposed on the contact regions and the second electrodes.

17. The package structure of claim 16, wherein the driving region for each of the first electrodes is a stripe pattern.

18. The package structure of claim 16, wherein each of the second electrodes is a stripe pattern.

19. The package structure of claim 16, wherein an extending direction of the first electrodes is perpendicular to an extending direction of the second electrodes.

20. The package structure of claim 16, wherein the OEL panel further comprises an electron mobile layer, disposed between the organic light emitting layer and the second electrodes.

21. The package structure of claim 20, wherein the OEL panel further comprises an electron injection layer disposed between the second electrodes and the electron mobile layer.

22. The package structure of claim 16, wherein the OEL panel further comprises a hole mobile layer, disposed between the organic light emitting layer and the first electrodes.

23. The package structure of claim 22, wherein the OEL panel further comprises a hole injection layer disposed between the first electrodes and the electron mobile layer.

24. The package structure of claim 16, wherein the poly solder interconnections includes silver paste.

25. The package structure of claim 16, wherein the patterned organic light emitting layer includes a plurality of openings, and the openings expose the contact regions.

26. The package structure of claim 16, wherein patterned organic light emitting layer includes a plurality of stripe patterns, whereby the contact regions are exposed.

27. The package structure of claim 16, wherein the poly solder interconnections include a material with a relative low reflowing temperature.

28. The package structure of claim 16, wherein poly solder interconnections are arranged into an array structure.

* * * * *